United States Patent [19]

Herdt et al.

[11] Patent Number: 5,065,362

[45] Date of Patent: Nov. 12, 1991

[54] NON-VOLATILE RAM WITH INTEGRATED COMPACT STATIC RAM LOAD CONFIGURATION

[75] Inventors: Christian E. Herdt; Albert S. Weiner; David A. Kamp; Klaus J. Dimmler, all of Colorado Springs, Colo.

[73] Assignee: Simtek Corporation, Colorado Springs, Colo.

[21] Appl. No.: 361,033

[22] Filed: Jun. 2, 1989

[51] Int. Cl.$^5$ .................. G11C 14/00; G11C 11/41
[52] U.S. Cl. .................. 365/154; 365/189; 365/226; 365/228
[58] Field of Search ............ 365/154, 156, 184, 185, 365/226, 228

[56] References Cited

U.S. PATENT DOCUMENTS

| | | | |
|---|---|---|---|
| 3,636,530 | 1/1972 | Mark et al. | 365/154 |
| 3,950,737 | 4/1976 | Uchida et al. | 365/228 |
| 4,044,343 | 8/1977 | Uchida | 365/184 |
| 4,090,259 | 5/1978 | Wilcock et al. | 365/191 |
| 4,143,286 | 3/1979 | Koike | 365/185 |
| 4,270,188 | 5/1981 | Saito | 365/154 |
| 4,271,487 | 6/1981 | Craycraft et al. | 365/154 |
| 4,370,798 | 2/1983 | Lien et al. | 437/46 |
| 4,403,306 | 9/1983 | Tokushige et al. | 365/156 |
| 4,541,006 | 9/1985 | Ariizumi et al. | 365/154 |
| 4,541,073 | 9/1985 | Brice et al. | 365/185 |
| 4,560,419 | 12/1985 | Bourassa et al. | 437/46 |
| 4,675,715 | 6/1987 | Lepselter et al. | 357/59 |
| 4,679,170 | 7/1987 | Bourassa et al. | 365/154 |
| 4,774,203 | 9/1988 | Ikeda et al. | 437/52 |
| 4,870,615 | 9/1989 | Maroyama et al. | 365/185 |
| 3,676,7117 | 7/1972 | Lockwood | 365/154 |

FOREIGN PATENT DOCUMENTS 0136994 7/1985 Japan ........................ 365/184

OTHER PUBLICATIONS

SNOS 1K×8 Static Nonvolatile RAM, IEEE Journal of Solid-State Circuits, vol. SC-17, #5.
The Metal-Nitride-Oxide-Silicon (MNOS) Transistor-Characteristics and Applications, Proceedings of the IEEE, vol. 58, #8.

Primary Examiner—Glenn Gossage
Attorney, Agent, or Firm—John R. Ley

[57] ABSTRACT

A non-volatile random access memory (NVRAM) cell of condensed size employs a pair of programmable threshold voltage devices, e.g. MNOS (metal nitride oxide semiconductor), SNOS (silicon nitride oxide semiconductor), SONOS (silicon oxide-nitride-oxide semiconductor) or floating gate transistors, in which different threshold voltage levels are established in accordance with the data signal levels existing on the data nodes of a flip flop, when the volatile data is stored in the programmable devices. During recall of the non-volatile stored data to the data nodes of the flip flop, the programmable devices actively conduct current to the data nodes to set the flip flop in the same state that existed when the data was stored. Power is supplied to the flip flop independently of the power supplied to the programmable devices. A single polysilicon conductor forms gates of transistors which connect the programmable devices to the data nodes and the gates of the flip flop transistors. A load device for each data node is integrated in the single polysilicon conductor. A dynamic program inhibit capability is achieved in each programmable device during the store operation, by applying a series of programming signal pulses.

19 Claims, 4 Drawing Sheets

NON-VOLATILE RAM WITH INTEGRATED COMPACT STATIC RAM LOAD CONFIGURATION

This invention relates to a new and improved cell for a non-volatile random access memory (NVRAM), wherein the circuitry, function and layout of the cell are advantageously integrated to reduce the number of components and the space consumed by the components, to achieve a higher integration density of cells per unit area on a semiconductor memory chip, while simultaneously achieving improved reliability in recalling data previously stored in non-volatile (NV) circuit elements of the Cell

BACKGROUND OF THE INVENTION

Non-volatile semiconductor memories, i.e. those that do not lose data when the electrical power is interrupted, have been available for many years. Many NVRAM cells employ a programmable threshold voltage device as a non-volatile (NV) element for nonvolatile data retention and a bistable multivibrator or flip flop as a static random access memory (SRAM) element for volatile data read and write operations. The programmable threshold voltage device usually does not function during normal volatile operation since the flip flop performs the data retention, read and write functions so long as electrical power is available. Before power is interrupted, or at the time when the interruption has been detected but has not yet taken effect, the programmable threshold voltage device is "programmed" to retain the data then present in the flip flop. In this manner the volatile data contained in the flip flop is not lost, but is retained by the programmable threshold voltage devices. Non-volatile semiconductor memories thus offer the long term data retentive characteristics of other types of computer memories, such as magnetic media, but offer considerably more convenience of use.

Examples of known programmable threshold voltage devices are metal nitride oxide semiconductor (MNOS) field effect transistors (FETs), silicon nitride oxide semiconductor (SNOS) transistors, silicon oxide nitride oxide semiconductor (SONOS) transistors and floating gate semiconductor transistors. All of these programmable devices have the common characteristic of being able to store an electrical charge for a long period of time within an internal structure between a silicon surface and a control gate. The stored charge programs the device, so that when the power is restored, the stored charge modifies the threshold voltage of the device and the resulting electrical characteristics. The programmed characteristics set the flip flop in a state which relates to the state of the flip flop just prior to the programming operation.

Each of the above mentioned programmable threshold voltage devices exhibits a finite lifetime of program/erase cycles (an "erase" occurring before the "program"), before the device loses its ability to reliably store a charge. Since the typical flip flop or SRAM may be set and cleared many times during normal computer operations, the finite lifetime of the programmable devices would be quickly reached if programmable devices were incorporated in the flip flop or SRAM portion of a NVRAM. Additionally, programming the programmable devices usually requires a relatively high voltage and a relatively long time to program the device, which would make the set and clear operations very slow during normal computer operations. It is for these reasons that the programmable devices are typically separate from the flip flop in the NVRAM cell circuit.

One of the primary considerations in the design of any semiconductor memory is the ability to produce as many memory cells on a semiconductor chip as possible. More memory cells per unit area of chip are desirable because the cost per unit of memory decreases, and a greater amount of memory is usually desirable in modern computers. The cost of manufacturing a semiconductor chip is generally governed by its area and not by the number of components it incorporates, so integrating more components on the chip does not increase the manufacturing cost in a theoretical sense. Accordingly much effort is devoted to reducing the number of components in a semiconductor circuit and laying out or arranging the components in a space efficient manner. Space economy is particularly important because the memory cell will be replicated many thousands of times in a single memory chip. Furthermore, if the circuitry of the cell itself can be arranged to minimize the number of components while still accomplishing the non-volatile and SRAM functions and to reduce the spacing between the components, the cell design will be more efficient.

The typical approach of combining a programmable device with a flip flop in an NVRAM cell is to connect one programmable device to each of the two data output nodes (true and complement) of the flip flop. The programmable threshold voltage devices usually function in one of two modes in such circumstances: either as capacitors, where the storage of charge establishes a differential in capacitance in the two devices as a result of the signal levels at the data output nodes at the time of programming; or as programmed current switches, where the stored charge modifies the threshold voltage at which the devices commence conducting current when the programmed data is recalled to the flip flop.

The capacitance approach, while providing some reduction of cell size through conservation of components, has the unfortunate characteristic of creating a data inversion when the programmed data is transferred to the flip flop. Another disadvantage is that the relative capacitance differential over time tends to diminish. A diminished relative capacitance greatly increases the risks of incorrectly setting the state of the flip flop during recall. The cell disclosed in U.S. Pat. No. 4,271,487 is an example of a differential capacitance approach.

The programmed current switch approach, while providing a more affirmative setting of the flip flop even after the passage of significant time, has had the disadvantage of requiring more space consuming components to operatively separate the non-volatile elements from the SRAM (flip flop) elements during normal operation. The cell disclosed in U.S. Pat. No. 3,636,530 is an example of a prior art current switch approach.

An important space consideration in the layout of memory cells involving programmable threshold voltage devices is that increased spacing must be provided to withstand the relative high voltages required for programming the programmable devices, to withstand the high voltage without breaking down the insulation and detrimentally affecting the other components or the circuit operation. If the circuit design of the cell requires the high voltage to be present at many different locations and on many different components, wider spacings and longer channel lengths are required. These requirements consume extra space, increase the size of the cell, and result in lower integration density and poorer chip performance.

Of course, another important consideration is minimizing the number of manufacturing steps necessary to produce the semiconductor memory chip. The various transistors, resistors and other elements are generally formed with layers upward from a silicon substrate. The layers, and the configuration of the components, are formed in separate process steps. If the layout of the circuit can be arranged to minimize the number of layers and connections between layers, a reduced number of process steps are required. By minimizing the number of process steps, the opportunities for errors or problems are reduced, while an overall reduction in the price of fabricating the semiconductor memory chip is achieved.

It is against this background of various considerations, and others, that the present invention has evolved.

SUMMARY OF THE INVENTION

In accordance with its broad aspects, the NVRAM cell of the present invention integrates non-volatile programmable threshold voltage devices with an SRAM or flip flop in a significantly improved manner. The programmable devices are connected to the data nodes of the flip flop as the more reliable programmed differential current switches, to more effectively recall the data levels to the flip flop. Independently controllable transistor switch means operatively connect the programmable devices to the data nodes of the flip flop and to a power source separate from that for the flip flop. A current flow to the data nodes is established during a data store and a data recall operation, and the programmable devices are disconnected from the separate power source during the data store operation. Programming the programmable device connected to the high level data node is dynamically inhibited during a store operation, due to the use of the transistor switch means.

A resistive load is connected to each data node of the flip flop and to a flip flop power source which is separate from the power source which supplies the differential current through the programmable devices. The separate power source for the flip flop is supplied through the resistive loads, and this power source also controls the conductivity of the transistor switch means which connect the programmable devices to the data nodes. By linking the conductivity of the transistor switch means with the application of power to the resistive loads of the flip flop, no load current is supplied to the data nodes which might adversely influence the differential currents applied by the programmable devices during the recall operation, thereby even further increasing the sensitivity for setting the flip flop in a recall operation.

The layout of the circuit is advantageous in that the resistive loads are included in a single level polysilicon line or conductor which simultaneously forms the gates of the two cross-coupled flip flop transistors and the two transistor switch means. Furthermore, the polysilicon conductor forming all of these common components is located in a single layer, making fabrication of the cell more efficient. The integration of these common components in a single polysilicon conductor layer, and the separate power control over the flip flop, and the integration of the resistive load in the single polysilicon conductor, substantially minimizes the amount of space consumed by the NVRAM cell of the present invention, reducing its size to that approximately comparable to a conventional SRAM itself without a non-volatile circuit.

A more complete appreciation of the scope of the present invention can be obtained from the accompanying drawings, which are briefly summarized below, from the following detailed description of a presently preferred embodiment, and from the appended claims.

DETAILED DESCRIPTION

Figure 1:
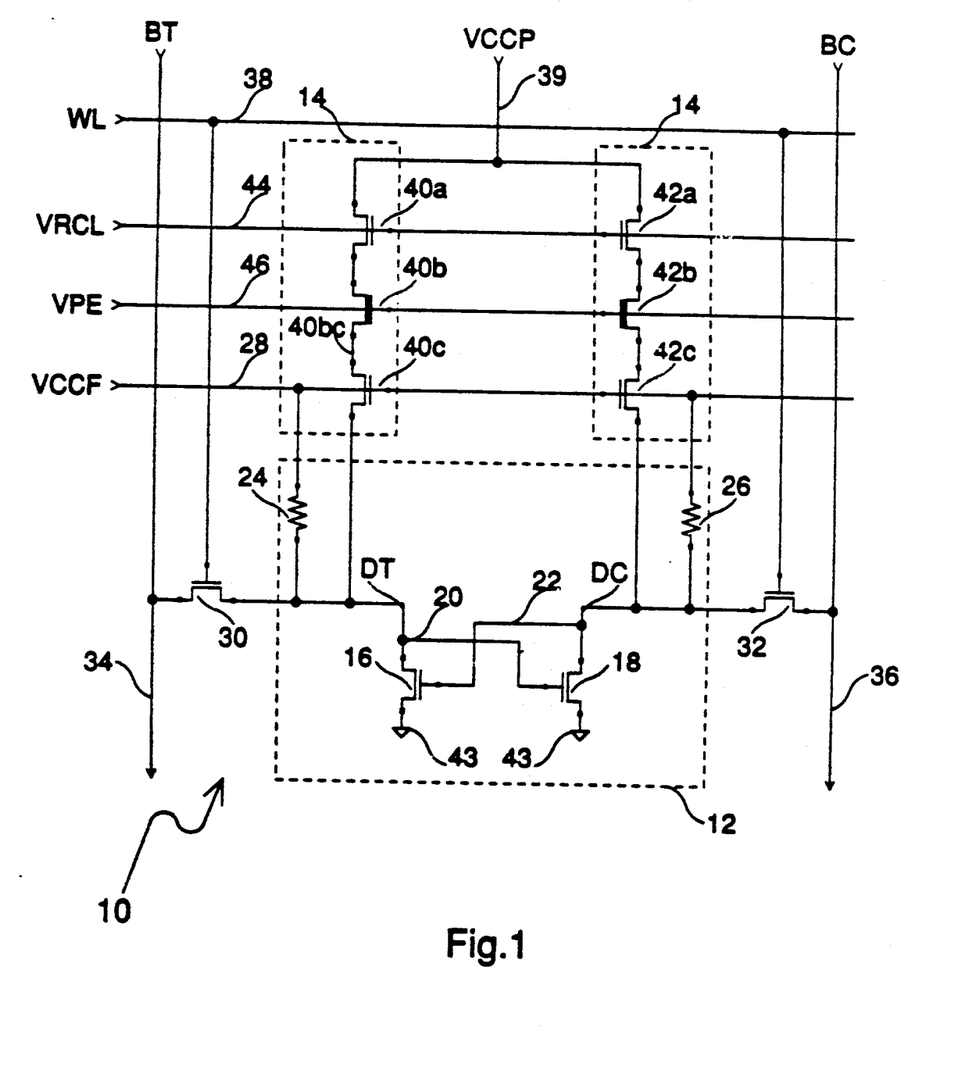
FIG. 1 is a schematic circuit diagram of a NVRAM cell embodying the present invention.

A presently preferred embodiment of a NVRAM cell 10 in which the present invention is incorporated is shown in FIG. 1. The cell 10 includes a flip flop 12 and a pair of non-volatile circuits 14. The components of the cell 10 are conventional FETs, preferably of the N channel type, resistances, conductors and insulators, all of which are formed using known semiconductor chip fabricating techniques. A multiplicity, for example tens or hundreds of thousands, of cells 10 are replicated in orthogonal columns and rows in one or more arrays on a single semiconductor chip.

Normal SRAM operation of the cell 10 is achieved by a flip flop 12 which is formed by a pair of transistors 16 and 18 connected in the conventional cross-coupled manner. The drains of the transistors 16 and 18 are connected to nodes 20 and 22, respectively, where the mutually opposite (true and complement) data level output signals from the flip flop 12 are presented. For convenience of description, the data levels at the nodes 20 and 22 will be respectively referred to as the data true (DT) and data complement (DC) signals. Load resistances 24 and 26 are connected between the data nodes 20 and 22, respectively, and an internal source of power VCCF for the flip flop 12 applied at conductor 28.

Access to the data nodes 20 and 22 is achieved through access transistors 30 and 32, respectively. The channels of the access transistors 30 and 32 are connected between the data nodes 20 and 22 and conductors 34 and 36, respectively. The conductors 34 and 36 are typically referred to as bit lines. The bit line conductors 34 and 36 extend to all of the cells replicated in a single vertical column in the array. Each vertical column of the cells has one common pair of bit line conductors. Control over the conductivity of the access transistors 30 and 32 is achieved by signals applied to a conductor 38 which is commonly connected to the gate terminals of both access transistors 30 and 32 and all of the gates of all of the other access transistors of all of the cells replicated in a single row in the array. The arrangement of the bit lines, the word lines and the access transistors is conventional.

To address any one specific cell in the array, for reading existing data from the flip flop 12, i.e. sensing the data, or for writing new data to the flip flop 12, i.e. setting new data, a signal (WL, FIG. 2) is applied to the word line conductor 38 of the row in which the addressed cell is present, to turn on or activate the access transistors 30 and 32 of all the cells in the row including the addressed cell. Approximately simultaneously, signals BT and BC, (FIG. 2) are written to, or read from, the bit line conductors 34 and 36 of the only column of cells in which the addressed cell is also present, when a data write or data read operation is desired, respectively. In this manner only the single cell controlled by the intersecting bit and word signals on the orthogonal bit and word lines is addressed for the data read or data write operation Address signals from the processor or other elements of the computer system are applied to decoders or other means (not shown) external to the cell 10 for deriving and supplying the bit and word line signals on the conductors 34, 36 and 38, as is known.

A non-volatile circuit 14 is connected to each data node 20 and 22 to retain in a non-volatile manner the data present on the data nodes 20 and 22 upon the interruption of power. Each non-volatile circuit 14 is connected between a source of electrical power VCCP on conductor 39 and one of the data nodes 20 or 22. Each non-volatile circuit 14 comprises one programmable voltage threshold device, such as a SNOS transistor 40b or 42b, connected between two conventional switching means MOS transistors 40a and 40c, or 42a and 42c, respectively. The sources and drains of the three transistors in each non-volatile circuit 14 are connected in series, and in the actual implementation shown in FIG. 4, the channels of all three transistors in each non volatile circuit 14 may extend in common sequence with adjacent transistors sharing common source and drain diffusion areas. The separate sources of electrical power VCCF applied on conductor 28 and VCCP applied on conductor 39 are preferably of the same magnitude, approximately 5 volts. The conductors 28 and 39 are collectively and individually examples of means for supplying electrical power to the cell. A common ground reference 43 is present in the cell 10 and on the chip.

A single conductor 44 commonly connects both gates of the transistors 40a and 42a. Another individual conductor 46 commonly connects the gates of the transistors 40b and 42b. The conductor 28, in addition to supplying power (VCCF) to the flip flop 12, also commonly connects and controls the gates of the transistors 40c and 42c. Separately connecting and controlling the gates of comparable transistors in each non-volatile circuit 14 achieves important improvements in erasing and programming the programmable transistors 40b and 42b during a store operation, and in enhancing the reliability of recalling back data from the programmable transistors to the flip flop during a recall operation, as is described below.

The function of transferring the volatile data from the flip flop 12 into the non-volatile circuits 14 is referred to herein as a store operation. A store operation involves two steps. The first step in the store operation is to erase the threshold voltage levels of the transistors 40b and 42b. The second step in the store operation is a programming step, which involves raising the conduction point or threshold voltage of the one transistor 40b or 42b which is connected to the low data node 20 or 22 and inhibiting a change in the threshold voltage from the erased level in the other transistor 40b or 42b which is connected to the high data node 20 or 22.

The function of transferring the non-volatile data from the programmable transistors 40b and 42b to the flip flop 12 is referred to herein as a recall operation A recall operation also involves two steps. The first step in the recall operation is set-up. During the set-up step the data nodes of the flip flop 12 are grounded to prevent the flip flop from regenerating to some arbitrary state just prior to recalling the non-volatile data. The second step in the recall operation is referred to herein as setting. During the setting step, current from both non-volatile circuits 14 is simultaneously applied to the data nodes of the flip flop 12. The non-volatile circuit 14 having the programmed (turned off) transistor 40b or 42b will supply less current to its connected data node than the non-volatile circuit 14 with the inhibited (conductive) transistor 40b or 42b will supply to the other data node. The data node receiving the greater current will be driven high more rapidly than the data node receiving the lesser current. This will raise the gate voltage of the flip flop transistor connected to the node receiving the lesser current pulling that data node low in a regenerative manner. Data is recalled to the flip flop 12 at the same levels as it existed prior to the store operation, among other advantages.

Figure 2:
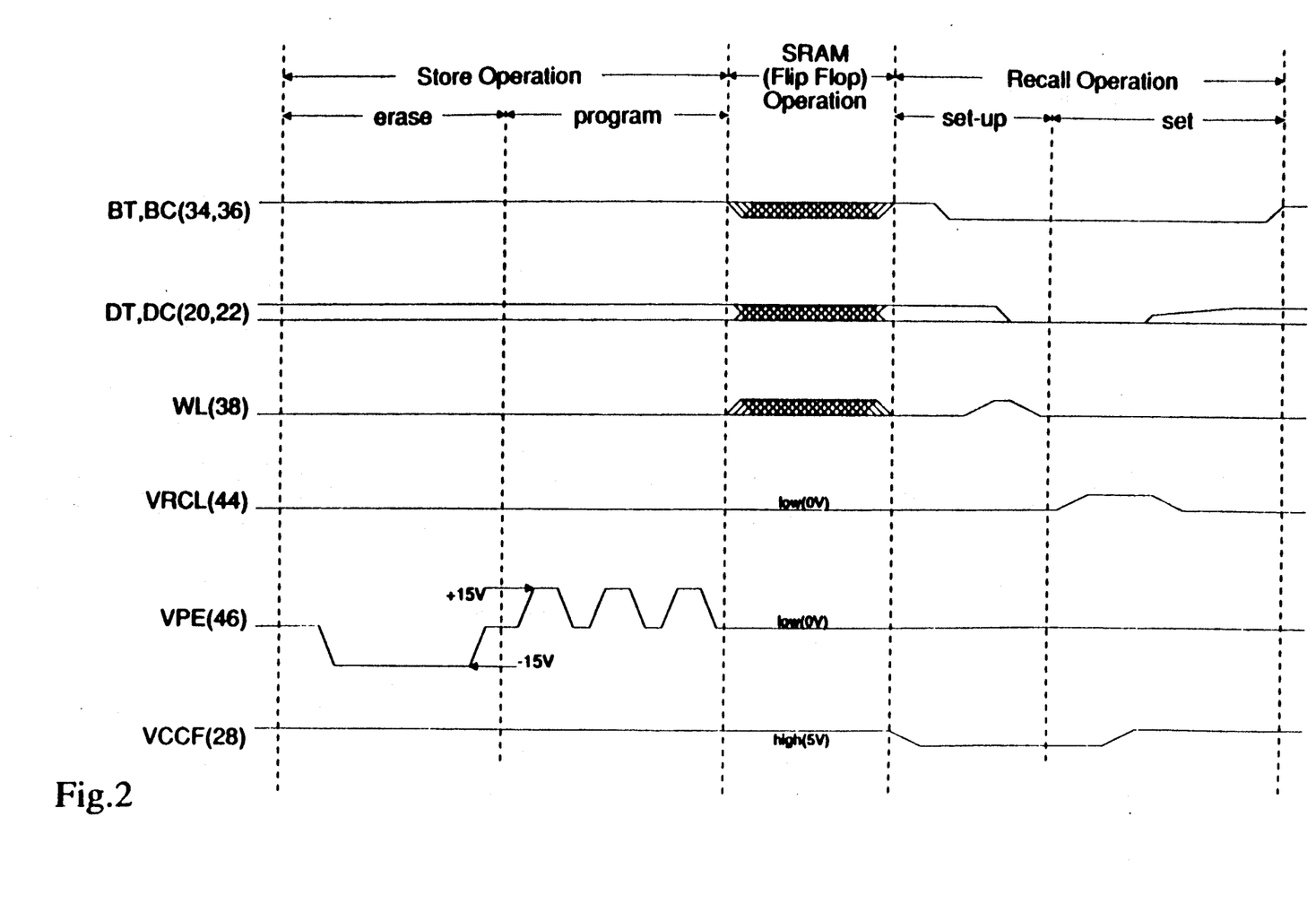
FIG. 2 illustrates waveforms present in and applied to the cell shown in FIG. 1 to illustrate the operation of the cell.

Details regarding the store and recall operations are better understood by referring to FIG. 1 in conjunction with the waveform diagrams shown in FIG. 2.

Figure 3:
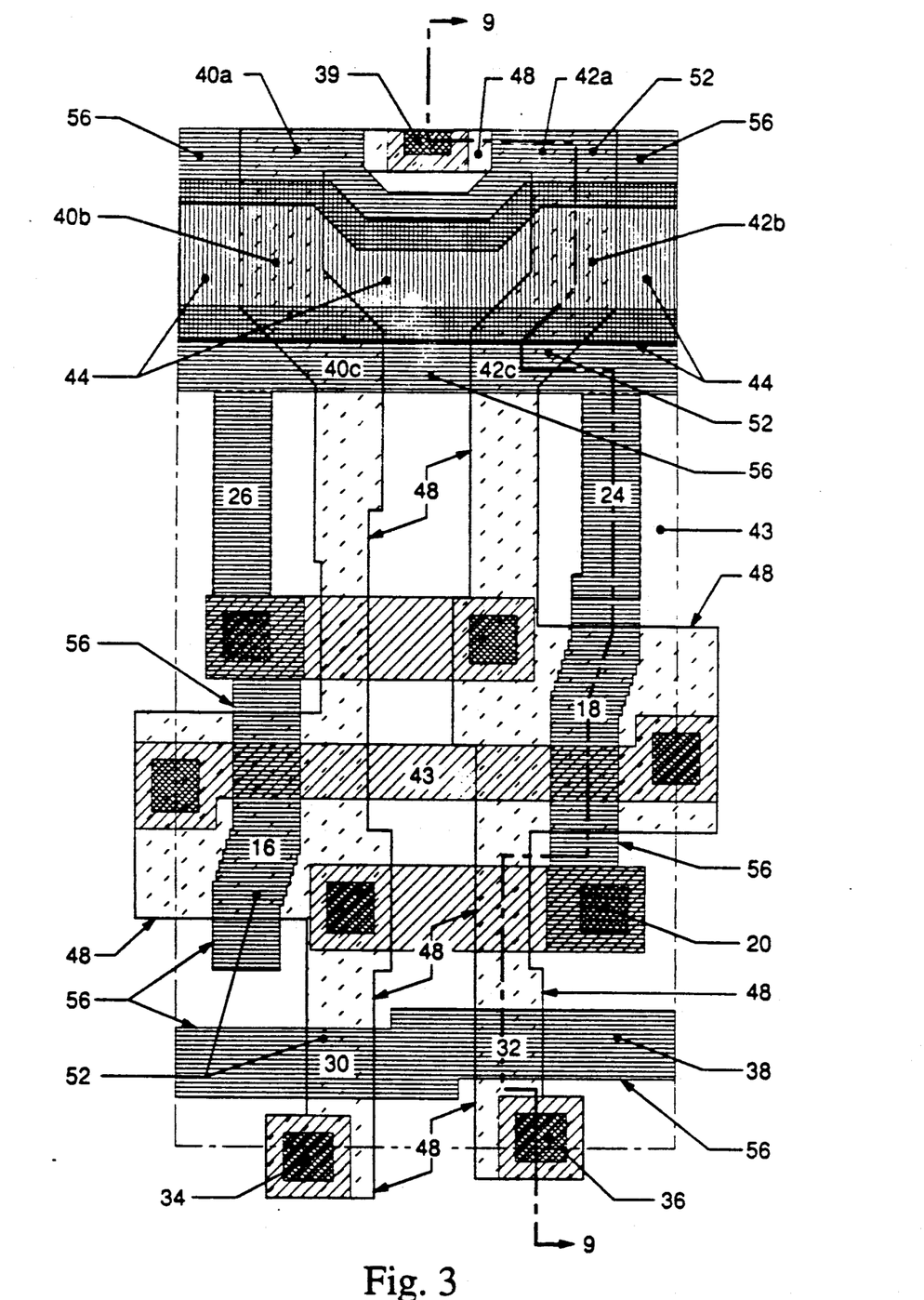
FIG. 3 is a fragmentary portion of a layout diagram of the components of the cell shown in FIG. 1.

During a store operation the bit line signals (BT and BC, FIG. 2) are high and the word line signal (WL, FIG. 2) is low. The data level signals (DT and DC, FIG. 2) on the data nodes 20 and 22, respectively, will be variable, depending on the state of the flip flop 12 just prior to the store operation. Consequently FIG. 3 illustrates the signals DT and DC at mutually opposite but nonspecific levels.

During the store operation, a recall signal (VRCL), applied on the conductor 44 to the gates of the transistors 40a and 42a, is held low as is illustrated in FIG. 2. The VRCL signal is generated by means not shown but which will be adequately understood by those skilled in the art. The transistors 40a and 42a will therefore be nonconductive since, as will be seen, the zero gate-to-source voltage on conductor 44 is insufficient to overcome the threshold voltage of transistors 40a and 42a. The power signal VCCF is applied to the gates of the transistors 40c and 42c, and because the VCCF level is high (FIG. 2) transistors 40c and 42c are conductive, thereby coupling the channels of transistors 40b and 42b to the signal levels which exist on the data nodes 20 and 22, respectively.

For purposes of exemplary description, it is assumed that the data signal level DC on the complement data node 22 is low, i.e. zero volts, and the data signal level DT on the true data node 20 is high, i e. 5 volts, at the time of the store operation When the data signal levels on the data nodes 20 and 22 are reversed, the same store operation occurs, but the functions and operations associated with the programmable transistors 40b and 42b of the non-volatile circuits 14 are reversed compared to the following description.

The primary operative signal during a store operation is an erase/program signal (VPE, FIG. 2) which is applied over the conductor 46 to the gates of the programmable transistors 40b and 42b. In the described embodiment, the transistors 40b and 42b are of the conventional SNOS structure, having a layer of nitride and oxide (54 and 52, respectively, FIG. 4) between the gate electrode and the channel silicon (46 and 49, respectively, FIG. 9). Charges tunnel into and are trapped in the nitride layer (54, FIG. 4) to set and modify the threshold voltage of the transistor 42b. The magnitude of the VPE signal necessary to store or modify the charge in the nitride layer depends on the thickness of the oxide layer and other structural considerations. The magnitude and polarity of the VPE signal attract the charges into the nitride layer to establish the different threshold conditions during both the erase and program steps of the store operation.

Both programmable transistors 40b and 42b are affected similarly during the erase step, regardless of the signal level of the data nodes 20 and 22 to which they are connected by the conductive transistors 40c and 42c. The erase step commences by bringing VPE to a sufficiently negative voltage, e.g. −15 volts, which is relatively high in a negative sense, to cause positive charges to tunnel into the nitride layer of each transistor 40b and 42b. After VPE has returned to zero volts, the trapped positive charge will attract negative charge to the surface of the channel silicon and consequently lower the conduction point of the transistors 40b and 42b. A negative threshold voltage is thereby established for both transistors 40b and 42b during the erase step.

It is of no consequence relative to the erase step that data node 20 is high and data node 22 is low, because the negative 15 volt VPE signal will create essentially the same effect on both transistors 40b and 42b. Both transistors 40b and 42b will be driven into accumulation and the potential across both nitride layers will be essentially the same. During the erase operation both transistors 40b and 42b achieve a substantially identical negative threshold voltage.

Both transistors 40b and 42b are turned on, due to their negative threshold voltages, when VPE is returned to ground as is shown in FIG. 2. Since both transistors are conductive they are referred to herein as being erased. Erasing both transistors prior to programming them assures that the data from the flip flop 12 will be reliably programmed into the transistors 40b and 42b during the program step.

The programming step of the store operation has a different effect on the programmable transistor of the non-volatile circuit 14 connected to the low data node than the programmable transistor of the non-volatile circuit 14 connected to the high data node. The programmable transistor connected to the low data node will be turned off, which is the condition referred to herein as being programmed The programmable transistor connected to the high data node will be inhibited from being programmed, despite its gate experiencing the same signal VPE as the other transistor which is programmed. When the transistor is inhibited, it will remain erased and thus retain its conductive characteristics.

In this descriptive example of the program step, the data node 22 is low. Transistor 42a is off and transistor 42c is on, connecting the channel of transistor 42b to ground at the low data node 22. Signal VPE is then elevated to a relatively high positive 15 volt level as is shown in FIG. 2. The relatively high VPE signal attracts negative charges into the nitride layer (54, FIG. 4) of the transistor 42b, changing its threshold voltage from the negative level established during the erase step to a more positive level. The more positive threshold voltage of transistor 42b causes it to become less conductive when VPE returns to ground. Transistor 42b is therefore programmed, and it will remain less conductive and programmed for a considerable period of time, e.g. years, until its threshold voltage is changed.

In the non-volatile circuit 14 connected to the high data node of the flip flop 12, the channel of the programmable transistor 40b, in this example, is connected to the high data level through the conductive transistor 40c when VPE returns to ground at the commencement of the program step. Transistor 40b is conductive as a result of a negative threshold voltage established during the erase step. This negative threshold voltage causes the channel region of transistor 40b to source follow transistor 40c, which is connected to the high data node rises to that positive voltage at which the transistor 40c cuts off, which in this example is about a positive 4 volts, assuming a threshold voltage of approximately 1 volt on transistor 40c. With both transistors 40a and 40c nonconductive, the channel of transistor 40b is disconnected and isolated from any source of charge.

When VPE is brought to the positive 15 volts during the program step as is shown in FIG. 2, the gate of transistor 40b is elevated to the same level, and the potential of the surface of the silicon channel is coupled upward as well, since it is isolated from any source of charge because of the nonconductive transistors 40a and 40c The silicon channel surface potential under the transistor 40b is closely coupled to the gate voltage and simply moves with the voltage VPE on the gate, keeping the voltage differential across the nitride layer low. Because the voltage differential between the gate and the channel required to change the threshold voltage is never achieved, the transistor 40b remains erased and is not programmed. It is inhibited from being programmed as a result of the silicon channel surface being isolated from any source of charge during this program step.

Programming of the transistor 40b in this example could occur if the voltage on the silicon channel surface was allowed to decrease sufficiently to establish enough differential to allow charges to tunnel into its nitride layer. To avoid this eventuality, it is desirable to periodically refresh the channel potential from the source of transistor 40c. Refreshing may be needed because the surface potential under the gate of transistor 40b is relatively high compared to the other voltages present at other locations in the cell 10, and the charge may leak off from the channel to the surrounding structures of the chip. The refreshing function is accomplished by periodically returning VPE to ground by creating pulses of VPE during the program step of the store operation as shown in FIG. 2. Each time that VPE returns to ground the source 40bc (FIG. 1) of transistor 40c charges to the positive 4 volts. The channel of transistor 40b also returns to a 4 volt potential because the positive charge accumulated in the nitride layer of the transistor 40b during the erase procedure is still present, keeping its threshold voltage negative.

Since VPE is cycled through a predetermined number of pulses as is shown in FIG. 2, inhibiting the programming of the programmable transistor 40b is dynamically achieved and is referred to as dynamic program inhibit. Depending on the integrity of the chip fabrication and the rate of generation of minority carriers, it may not be necessary to cycle VPE through a number of individual pulses during the program step of the store operation as shown in FIG. 2, but it still may be desirable to do so to assure adequate charge retention characteristics near the end of life cycle of the programmable transistors.

After completing the program step of the store operation, VPE is returned to ground. The charge in the nitride layer of the programmable transistor 40b has not been changed from that established during the erase step of the store operation, due to the dynamic program inhibit functionality discussed above. Consequentially, transistor 40b still remains erased (conductive) and transistor 42b still remains programmed (nonconductive), in this example.

Normal SRAM operations of reading and writing the flip flop 12 occur as is illustrated by the middle portions of the waveforms shown in FIG. 2, without affecting the erased and programmed conditions of transistors 40b and 42b, respectively, in this example. Furthermore, power for the cell 10, VCCF and VCCP, can be interrupted and the charge accumulated in the nitride layers of the programmable transistors will remain except for the normal expected leakage. With modern semiconductor manufacturing processes it is reasonable to expect that sufficient charge will remain in the nitride layer to allow the non-volatile circuits 14 to successfully recall data to the flip flop 12 for many years.

The recall operation commences with a set-up step as is shown in FIG. 2. At the beginning of a recall operation, there may be some volatile data on the data nodes of the flip flop, either from the flip flop assuming some arbitrary state upon application of the power or because normal SRAM operations may have occurred between the time of the store operation and the time of initiating a recall operation. To prevent further operation of the flip flop 12, its power signal VCCF is first removed, as is shown by FIG. 2. It is further desirable to discharge any residual charge or signal on the data nodes by connecting the data nodes to the bit lines, BT and BC, lowering the signals BT and BC on the bit line conductors 34 and 36 to ground as is shown in FIG. 2, and applying the signal WL (FIG. 2) on the word line conductor 38 to turn on the access transistors 30 and 32. The data nodes 20 and 22 are discharged by holding them to the bit lines while the bit lines are held to ground as shown in FIG. 2. The flip flop 12 is now conditioned so that neither of its data nodes 20 or 22 has a higher voltage on it, both data nodes will experience the same voltage, and neither data node will have an adverse affect on the operation of the non-volatile circuits 14 during the recall operation. VPE remains at ground during the recall operation to allow the erased and programmed threshold voltages of the programmable transistors 40b and 42b to have their different effects on the conductivity of these transistors.

The set step of the recall operation is commenced by elevating the recall signal VRCL from 0 volts to 5 volts, as is shown in FIG. 5, which is sufficient to turn on transistors 40a and 42a. The signals VPE and VCCF are still at ground at this time so there is no effect on the non-volatile circuits 14. Thereafter power VCCF to the flip flop is restored, as is shown in FIG. 2, the flip flop 12 is energized, and the transistors 40c and 42c are turned on by the application of VCCF to their gates. A conduction path exists from conductor 39, VCCP, through the transistors 40a, 40b and 40c to the true data node 20, because transistor 40b has remained in the erased state (turned on) established during the store operation, in this example. Transistor 42b, however, is less conductive because it was programmed (turned off) during the store operation. Consequentially a reduced current or none at all is conducted through the transistors 42a, 42b and 42c to the complement data node 22. A larger current will therefore flow into the true data node 20. This current will flow to the gate of the cross-coupled transistor 18 of the flip flop 12, and transistor 18 will pull the data node 22 low. The low level signal on node 22 will cause the regenerative effect of turning off transistor 16 and the true data node will become high.

Recalling that the exemplary states of the flip flop 12 chosen to illustrate the operation of the cell 10 were a high true data node 20 and a low complement data node 22, it can be appreciated that the same data levels existing on the flip flop at the commencement of the store operation are restored or recalled to the flip flop as a result of the recall operation.

A substantial improvement occurs as a result of using the programmable transistors 40b and 42b as active current switches instead of capacitors. The use of the programmable transistors as capacitors is described in the remainder of this paragraph. The capacitor technique utilizes the inherent capacitance of the programmable transistors connected to each data node to set the flip flop. The threshold voltage of the programmable transistors, which is established during the store operation, controls the capacitance of each programmable transistor. The threshold voltage defines the point in a charging curve where the capacitance of each programmable transistor increases substantially. When both programmable transistors are subjected to the same voltage at the beginning of the recall operation, one starts exhibiting a capacitance before the other because its threshold voltage is reached first when voltage is first applied. Due to the relative time between which the two programmable transistors start exhibiting capacitances, a difference in charging rates of the two data nodes is established, although once the threshold voltages of the transistors are reached during the charging period during recall, the programmable transistors exhibit little relative difference in gate capacitance. Recalling the correct data state to the flip flop depends on this capacitive-induced charging differential. It can be appreciated that a relatively small initial voltage differential reduces the relative capacitance differential and increases the chances for incorrectly recalling the correct data state.

On the other hand, the present technique of using the programmable transistors as active current switches is a significant improvement because it makes the magnitude of the output currents considerably different in a relative sense. The threshold voltage, established during the store operation, controls the conductivity of each programmable transistor. The relationship between the threshold voltage and the conductivity is such that relatively great changes in output current result from relatively small changes in threshold voltage. Consequently, considerably greater differential current is available to drive the data nodes and set the flip flop in a more reliable manner with the present invention than with the capacitor approach. To illustrate, the magnitude of capacitance differential available from a pair of capacitor programmable transistors is approximately linearly related to the magnitude of the difference in threshold voltages of the two programmable transistors, but the magnitude of current differential available from the pair of programmable transistors 40b and 42b acting as active current sources is approximately exponentially related to the magnitude of the difference in threshold voltages.

Another important improvement occurs in data retention as a result of using the programmable transistors 40b and 42b as active current sources instead of capacitors. Over time, the threshold voltages of the programmable transistors decay. Although modern manufacturing techniques may offer the possibility that the threshold voltages will remain for many years, a definite decay nevertheless occurs. As the threshold voltages of capacitor programmable transistors decay, the relative difference between the thresholds decreases along with an accompanying decrease in differential displacement current created by the decaying threshold voltages, making the correct recall of data even more difficult. As the threshold voltages of the active current source programmable transistors decay, the current multiplying capability of the transistors still exists to supply a significant current differential, although at different thresholds, to establish the correct data levels from the flip flop 12, even after the thresholds have decayed considerably. As an example, the cell 10 of the present invention is calculated to be able to successfully recall data when the current differential from the two non-volatile circuits 14 is in the range of nanoamperes or less. Cells using capacitor programmable transistors are not easily capable of such levels of sensitivity in correctly recalling data. Consequentially, it is expected that data can be successfully recalled from the non-volatile circuits 14 of the present invention for a considerably longer time period than from the prior cells using capacitor programmable transistors.

Another advantage of using the programmable transistors as active current switches is that the symmetry of the cell is maintained, as is shown in FIG. 3. Symmetry inherently achieves a current balance supplied to the data nodes of the flip flop, thereby avoiding conditions where unbalanced currents might induce adverse noise signals at the data nodes.

Since data inversion is avoided in the cell 10, the need for additional inverters and other associated data level correcting circuitry on the chip is eliminated. The amount of area that would otherwise be consumed by these additional components is available for occupation by additional cells 10, thereby achieving more memory capacity through greater integration density. The problems of testing the correct operation of many thousands of cells on a memory array when data inversion occurs, which is typical with capacitor programmable transistor cells, can be extremely difficult to overcome. The present cell, by eliminating data inversion, allows each cell to be directly and efficiently tested for correct operation during fabrication.

The ability to selectively disconnect the flip flop from the power supply VCCF separately from the power supply VCCP to the non-volatile circuits while simultaneously gating the switching transistors 40c and 42c during the recall operation, is also a further improvement. Separate conductors to power the flip flop 12 and to control the transistors 40c and 42c are not needed, with a resulting savings in the space consumed by the cell 10. Power to the flip flop 12 is easily terminated during the recall operation (FIG. 2) when equilibration occurs, in distinction to some prior cells which attempt to equilibrate when the flip flop is energized. The load currents supplied to the data nodes from the flip flop power supply VCCF during equilibration tend to counter the recall currents from the non-volatile circuits, thereby increasing the risk of an incorrect data recall. The conductivity of the transistors 40c and 42c is directly controlled to route the differential current to the data nodes 20 and 22 at the same time that power is initiated to the flip flop 12, thereby reducing the possibility that the flip flop 12 could start to internally regenerate to an arbitrary data level as a result of the power application and before the differential current from the non-volatile circuits 14 became effective to set the flip flop 12.

The simultaneous control over both the differential recall current and the power to the flip flop 12 also avoids the use of an additional signal generator to supply a separate signal for controlling either the power to the flip flop 12 or to the gates of transistors 40c and 42c. Also avoided are the problems of timing separate signals so the application of power to the flip flop 12 would not regenerate an arbitrary data state or adversely influence the differential current supplied by the non-volatile circuits 14 to the data nodes prior to the time that the differential currents have their desired effect of establishing the correct data states during the recall operation.

Figure 4:
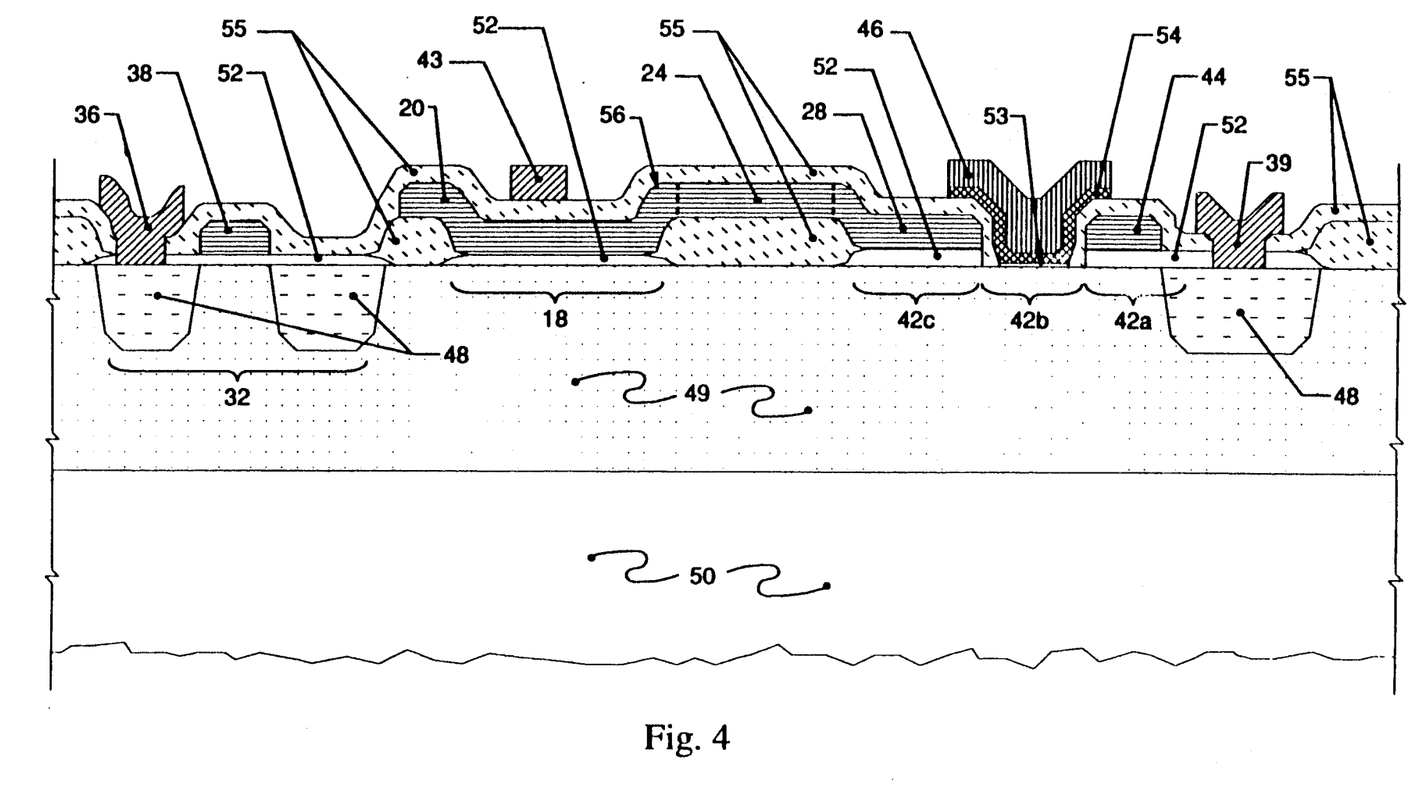
FIG. 4 is a section view taken in the plane of line 4—4 of FIG. 3.

A number of significant improvements result from a very advantageous implementation of the circuit shown in FIG. 1 within the cell layout shown in FIGS. 3 and 4. Although the cross-section view of FIG. 4 is only through essentially one-half of the cell 10, showing only transistors 42a, 42b, 42c, 18 and 32, it is apparent from the symmetry of the cell shown by FIG. 3 that similar function and structure are applicable to the transistors 40a, 40b, 40c, 16 and 30, respectively, in the other half of the cell.

The transistors 42a, 42b and 42c of the non-volatile circuit share a common channel from an active area 48 in a lightly P doped area 49 (also the ground reference 43) of a silicon substrate 50 for the chip. The metal conductor 39 supplies the VCCP power to the active area 48 of transistor 42a. A gate oxide layer 52 separates the conductors 44 and 28 from the diffusion area 49. The gate oxide layer underlays the polysilicon layer and is therefore not shown in FIG. 3. The conductors 44 and 28 form the gates of the transistors 42a and 42c, respectively The programmable transistor 42b additionally includes a tunnel oxide layer 53 and a memory nitride layer 54 between its gate, formed by conductor 46, and the oxide layer 52. The layer stores the charge that establishes the diffusion area 49. The tunnel oxide layer 53 separates the nitride layer 54 from the channel area 49 and is relatively thin compared to the thickness of the oxide layer 52 between the gates and the channel area 49 of the transistors 42a and 42c. The other diffusion area for the transistors 42a, 42b and 42c is not shown in FIG. 4, due to the location of the view taken along the cross-section line. However this diffusion area is shared between transistor 42c, the access transistor 32 and the flip flop transistor 18, as shown in FIGS. 3 and 4. Insulator material 55, applied in separate layers, isolates various cell elements.

The word line conductor 38 forms the gate for the access transistor 32, as is shown in FIG. 4. If transistor 18 is conductive, for example, when the access transistor 32 is turned on, the bit line 36 will be pulled low. Conversely, if transistor 18 is non-conductive when access transistor 32 is turned on, the bit line will remain high because the transistor 18 does not connect transistor 32 to the grounded area 49.

The conductor 28, the gates of transistor 42c and 40c, the gates of flip flop transistors 18 and 16, and the polysilicon loads 26 and 24 are all commonly conductive. These common elements are implemented in a very efficient manner in a single polysilicon line or conductor 56. The single polysilicon conductor 56 is formed all in one operation during what is commonly known as the poly 1 layer fabrication step of the cell 10, with a significant savings in time and manufacturing effort. The polysilicon loads are created during fabrication of the cell by doping the segments of the conductor 56 as a resistance or as a pair of back to back diodes, as is known. As is shown in FIG. 4, the polysilicon area load 24 separates the gate (28) of transistor 42c from the gate (20) of transistor 18.

Integrating the common elements in the single polysilicon conductor 56 achieves a substantial reduction in size of the cell. In actual implementation, the cell 10 of the present invention is approximately the same size as a conventional SRAM cell using the same design rules. Such integration allows the NVRAM cell of the present invention to achieve approximately the same density that has previously been available only for volatile memories. As an example, the highest previously known integration density of NVRAM cells is about 4K, but the present invention easily achieves a 64K integration density.

The polysilicon load resistances 24 and 26 could not be used in the space saving manner described above if dynamic program inhibit were not also implemented. In most other NVRAM cells, static program inhibit is used. Static program inhibit involves impressing the high programming voltage on the flip flop data nodes. In addition to requiring greater spacing of the flip flop elements to guarantee the necessary degree of electrical isolation to withstand these relative high voltages, the presence of high voltage could preclude the use of the polysilicon load devices. As was understood from the description of the store operation, dynamic program inhibit causes the high voltage to be confined only to the gate of the programmable transistors. Consequentially, the flip flop elements can be spaced compactly with minimum spaces separating the relative low voltage SRAM circuit components and the polysilicon load resistances.

A presently preferred embodiment of the cell of the present invention and a number of its improvements have been described with a degree of particularity. It should be understood however that this description has been made by way of preferred example and the invention itself is defined by the scope of the appended claims.

The invention claimed:

1. A non-volatile static random access memory (NVSRAM) cell, comprising:
    power supply means for supplying electrical power to said cell relative to a reference potential;
    a flip flop having a true data node and a complement data node, the flip flop comprising a pair of cross-coupled flip flop transistors, one flip flop transistor having a control terminal connected to the true data node, a reference terminal electrically connected to the reference potential and an output terminal connected to the complement data node, and the other flip flop transistor having a control terminal connected to the complement data node, a reference terminal electrically connected to the reference potential and an output terminal connected to the true data node;
    a pair of non-volatile circuits respectively connected to said true and complement data nodes, each non-volatile circuit comprising a programmable threshold voltage device having a gate terminal which is receptive of program and erase signals which establish different levels of threshold voltage for that programmable threshold voltage device in accordance with the level of the signal at its respective data node, a first transistor switch means having a control terminal which is receptive of a signal to allow the first transistor switch means to conduct and connect a corresponding programmable threshold voltage device to its respective data node when the program and erase signals are applied and when a data recall operation occurs, and a second switch means having a control terminal which is receptive of a signal to allow the second switch means to selectively conduct current from the power supply means through a corresponding programmable threshold voltage device and first transistor switch means to its respective data node during the data recall operation to establish a signal level at its respective data node related to the threshold voltage of the corresponding programmable threshold voltage device;
    means commonly connecting the gate terminals of the programmable threshold voltage devices for conducting the program and erase signals to the gate terminals of the programmable threshold voltage devices; and
    conductor means connected to the power supply means and including an integral resistive load for conducting power to the true data node and also including another integral resistive load for conducting power to the complement data node, the conductor means and the integral resistive loads energizing the flip flop to maintain the signals at the data nodes resulting from the previous operation of the flip flop as a static random access memory during application of the erase signals to the programmable threshold voltage devices.

2. A NVSRAM cell as defined in claim 1 wherein:
    the conductor means further commonly connects the control terminals of the first transistor switch means of both non-volatile circuits; and
    both first transistor switch means become conductive in response to the application of electrical power conducted by the conductor means from the power supply means.

3. A NVSRAM cell as defined in claim 1 or 2 wherein:
    the conductor means includes a polysilicon conductor and each resistive load includes a segment of polysilicon having greater resistivity than the polysilicon in a remaining portion of the polysilicon conductor, each segment of greater resistivity polysilicon being located in the polysilicon conductor which leads to a corresponding data node.

4. A NVSRAM cell as defined in claim 3 wherein:
    each segment of greater resistivity polysilicon is directly connected between the corresponding data node and the power supply means.

5. A NVSRAM cell as defined in claim 4 wherein:
    the conductor means is a polysilicon conductor;
    each of the resistive loads is a segment of polysilicon having greater resistivity than the polysilicon in the remaining portion of the polysilicon conductor and is located in the polysilicon conductor which leads to a corresponding data node;
    the control terminal of each first transistor switch means and the control terminals of the flip flop transistors are each a portion of the polysilicon conductor; and the polysilicon conductor is formed as a single layer.

6. A NVSRAM cell as defined in claim 1 wherein:

the power supply means comprises a first power supply means and a second power supply means;

the first power supply means supplies electrical power to the flip flop through the conductor means and both integral resistive loads;

the second power supply means supplies electrical power to each non-volatile circuit; and each second switch means selectively connects the second power supply means to its corresponding programmable threshold voltage device.

7. A NVSRAM cell as defined in claim 6 wherein:

the conductor means further commonly connects the control terminals of the first transistor switch means of both non-volatile circuits; and both first transistor switch means become conductive in response to the application of electrical power conducted by the conductor means from the power supply means.

8. A NVSRAM cell as defined in claim 7 wherein:

the conductor means includes a polysilicon conductor and each resistive load includes a segment of polysilicon having greater resistivity than the polysilicon in a remaining portion of the polysilicon conductor, each segment of greater resistivity polysilicon being located in the polysilicon conductor which leads to a corresponding data node.

9. A NVSRAM cell as defined in claim 8 wherein:

each segment of greater resistivity polysilicon is directly connected between the corresponding data node and the first power supply means.

10. A NVSRAM cell as defined in claim 9 wherein:

the conductor means is a polysilicon conductor;

each of the resistive loads is a segment of polysilicon having greater resistivity than the polysilicon in the remaining portion of the polysilicon conductor and is located in the polysilicon conductor which leads to a corresponding data node;

the control terminal of each first transistor switch means and the control terminals of the flip flop transistors are each a portion of the polysilicon conductor; and the polysilicon conductor is formed as a single layer.

11. A NVSRAM cell as defined in claim 1, 2 or 6 wherein:

signal levels at the data nodes are stored in the non-volatile circuits to which the data nodes are connected during a store operation by establishing a programmable current conductivity characteristic for each programmable threshold voltage device of the non-volatile circuits in accordance with the signal level at a data node to which an associated programmable threshold voltage device is connected by a corresponding first transistor switch means;

the store operation includes a first erase step in which substantially equal conductivity characteristics of both programmable threshold voltage devices are established and an immediately following program step in which the conductivity of one of the programmable threshold voltage devices is changed; and the conductor means and the integral resistive loads continually energize the flip flop throughout the store operation to maintain the signal levels at the data nodes throughout the store operation.

12. A NVSRAM cell as defined in claim 11 wherein:

signals are applied to the control terminals of each first transistor switch means continually throughout the store operation to maintain the conductivity of each first transistor switch means throughout the store operation.

13. A NVSRAM cell as defined in claim 12 wherein:

during the program step of the store operation a repeating pulse voltage signal is applied to the gate terminals of both programmable threshold voltage devices.

14. A NVSRAM cell as defined in claim 13 wherein:

each programmable threshold voltage device is fabricated from materials which include silicon nitride.

15. A NVSRAM cell as defined in claim 12 wherein:

during the erase step of the store operation a signal of a negative potential relative to the potentials of the signals at both data nodes is applied to the gate terminals of both programmable threshold voltage devices.

16. A NVSRAM cell as defined in claim 15 wherein:

during the program step of the store operation a repeating pulse voltage signal is simultaneously applied to the gate terminals of both programmable threshold voltage devices.

17. A NVSRAM cell as defined in claim 15 wherein:

the erase signal applied to the gate terminals of the programmable threshold voltage devices during the erase step establishes a common threshold voltage on both programmable threshold voltage devices;

a program signal applied to the gate terminals of the programmable threshold voltage devices during the program step establishes a different conductivity characteristic of a corresponding programmable threshold voltage device in accordance with the data level signal on one data node while leaving the conductivity characteristic of the other programmable threshold voltage device substantially unchanged from the level established by the erase signal; and the erase signal and the program signal are respectively different voltage polarities.

18. A NVSRAM cell as defined in claim 17 wherein:

the program signal is a repeating pulse signal which is applied to the gate control terminals of the programmable threshold voltage devices and which has a potential continually of the opposite polarity relative to the erase signal.

19. A NVSRAM cell as defined in claim 18 wherein:

each programmable threshold voltage device is a silicon nitride oxide semiconductor (SNOS) transistor.

* * * * *